United States Patent [19]

Carson et al.

[11] Patent Number: 5,382,913
[45] Date of Patent: Jan. 17, 1995

[54] METHOD AND APPARATUS FOR GENERATING TWO PHASE-COHERENT SIGNALS WITH ARBITRARY FREQUENCY RATIO

[75] Inventors: Lansing M. Carson; Dean J. Boman, both of Chandler, Ariz.

[73] Assignee: Motorola, Inc.

[21] Appl. No.: 43,042

[22] Filed: Mar. 29, 1993

[51] Int. Cl.⁶ .................. H03K 5/00; H03K 6/00
[52] U.S. Cl. ..................... 327/141; 327/105
[58] Field of Search ............ 307/510, 511, 513; 328/55, 155, 14

[56] References Cited

U.S. PATENT DOCUMENTS

| | | | |
|---|---|---|---|
| 4,213,094 | 7/1980 | Wood | 370/12 |
| 4,305,041 | 12/1981 | Frerking | 328/155 |
| 4,443,767 | 4/1984 | Reichert et al. | 325/155 |
| 5,164,677 | 11/1992 | Hawkins et al. | 325/55 |

*Primary Examiner*—William L. Sikes
*Assistant Examiner*—Fetsum Abraham
*Attorney, Agent, or Firm*—Jeffrey D. Nehr

[57] ABSTRACT

A method and apparatus for generating two phase-coherent first and second signals with arbitrary frequency ratio includes programming a first numerically controlled oscillator (NCO) with a first frequency word to produce a first NCO output. The first NCO output is processed to produce the first signal. The first frequency word is multiplied in a multiplier to produce a second frequency word which is corrected in phase relative to the first frequency word. A second NCO is programmed with the corrected second frequency word to produce a second NCO output. The second NCO output is processed to produce the second signal.

26 Claims, 3 Drawing Sheets

METHOD AND APPARATUS FOR GENERATING TWO PHASE-COHERENT SIGNALS WITH ARBITRARY FREQUENCY RATIO

FIELD OF THE INVENTION

This invention relates in general to methods and apparatus for generating two phase-coherent signals and in particular to methods and apparatus for generating two phase-coherent signals with arbitrary frequency ratio.

BACKGROUND OF THE INVENTION

Methods and apparatus for generating two phase-coherent signals with arbitrary frequency ratio have application in a variety of devices, particularly phase-coherent transponders. Phase-coherent transponders receive a radio frequency (RF) signal on one frequency and transmit a signal on a different frequency in response. The input and output frequencies of the transponder are phase-coherent and are related by a turn-around ratio, also known as the coherency ratio. Typical technology to generate two phase-coherent signals requires elaborate multiplier/divider chains to generate the signals. Such technology is not flexible, and requires a unique hardware design for each frequency ratio desired. A single design does not provide for the generation of arbitrary frequency ratios.

Multiplier/divider technology achieves coherency of the input and output signals by repeatedly multiplying and dividing an input signal (e.g. multiplication by two followed by division by 3, etc.) to generate the output signals. Such implementations require complex hardware, with a corresponding large number of gates, cost, power, and area, especially if the desired coherency ratio M/N is the quotient of two relatively large numbers, e.g. 256/205.

Other methods and apparatus for generating two phase-coherent signals of differing frequency ratio involve changing coherency ratios over time, without feedback, or using different reference clocks. The method of changing coherency ratios over time requires an arithmetic processor, however, and using different reference clocks is valid only for one frequency ratio.

Thus, what is needed is an apparatus and method which is flexible and provides for arbitrary frequency ratios of the generated two phase-coherent signals within a single design. It is desirable if the arbitrary frequency ratio can be programmed without hardware changes.

SUMMARY OF THE INVENTION

Accordingly, it is an advantage of the present invention to provide a new and improved apparatus for generating two phase-coherent signals. It is a further advantage of the present invention that the two phase-coherent signals can be of arbitrary frequency ratio.

To achieve these advantages, a device for generating phase-coherent first and second signals with an arbitrary frequency ratio is contemplated which includes a first numerically controlled oscillator (NCO) for receiving a first frequency word and producing a first NCO output. A first digital to analog (D/A) converter is coupled to the first NCO, the D/A converter for processing the first NCO output to produce the first signal. A multiplier for receiving the first frequency word and for multiplying the first frequency word to produce a second frequency word is coupled to a frequency corrector. The frequency corrector corrects the second frequency word for error in phase relative to the first frequency word. A second NCO receives the corrected second frequency word and produces a second NCO output. The second NCO is coupled to the frequency corrector. A second D/A converter processes the second NCO output to produce the second signal.

To further achieve these advantages, a method for generating phasecoherent first and second signals with an arbitrary frequency ratio is contemplated including programming a first numerically controlled oscillator (NCO) with a first frequency word to produce a first NCO output, processing the first NCO output to produce the first signal, multiplying the first frequency word in a multiplier to produce a second frequency word, correcting the second frequency word for error in phase relative to the first frequency word, producing a corrected second frequency word, programming a second NCO with the corrected second frequency word to produce a second NCO output, and processing the second NCO output to produce the second signal.

The above and other features and advantages of the present invention will be better understood from the following detailed description taken in conjunction with the accompanying drawings.

DETAILED DESCRIPTION OF THE PREFERRED EMBODIMENT

Figure 1:
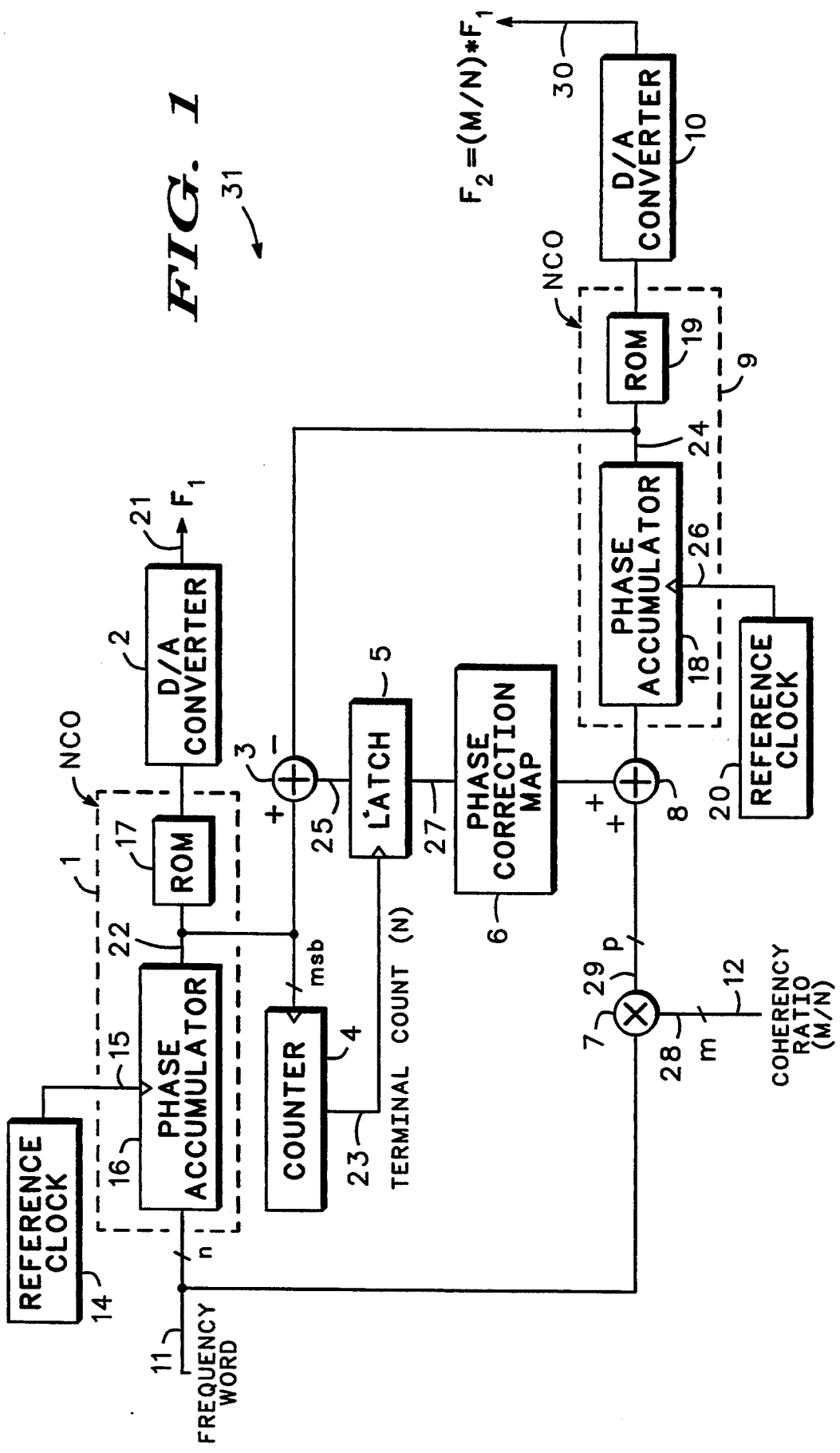
In FIG. 1, there is shown a schematic of a device for generating two phase-coherent signals with arbitrary frequency ratio in accordance with a preferred embodiment of the invention.

FIG. 1 illustrates a schematic of a device for generating two phase-coherent signals with arbitrary frequency ratio. Frequency word 11, which may comprise an n-bit frequency word, is input to numerically controlled oscillator 1 (NCO). NCO 1 comprises phase accumulator 16 and read-only-memory (ROM) 17. Reference clock 14 provides reference clock signal 15 as an input to phase accumulator 16.

Phase accumulator 16 also receives the frequency word 11 input. Phase accumulator 16 provides phase accumulator output 22 to ROM 17. The output of ROM 17 is coupled into digital-to-analog converter (D/A) 2. The output of D/A converter 2 is output signal 21, $F_1$.

NCO 1 functions by providing a digital amplitude output based on a plurality of frequency word 11 inputs. The outputs of phase accumulator 16 from NCO 1 are converted to an analog signal output from D/A converter 2. It is the D/A converter 2 output from the phase accumulation of frequency words 11 which comprises output signal 21.

The same frequency word 11 input to NCO 1 is also input to multiplier 7. Multiplier 7 also receives a coherency ratio (M/N)input 12, which is input as an m-bit word 28 to multiplier 7. Multiplier 7 produces multiplier output 29, which is a p-bit output. Multiplier output 29 forms a second frequency word input to adder 8.

The output of adder 8, frequency control word 13, is input to NCO 9.

NCO 9 comprises phase accumulator 18 and ROM 19. Phase accumulator 18 receives frequency control word 13 from adder 8. Phase accumulator 18 also receives reference clock signal 26 from reference clock 20. Reference clock 20 may be the same clock as reference clock 14, but if reference clock 20 is distinct, reference clock signal 15 must be synchronized with reference clock signal 26. The output of phase accumulator 18 is phase accumulator output 24. Phase accumulator output 24 is used to address into ROM 19 to obtain a digital amplitude word that is converted into an analog signal using D/A converter 10. The converted signal forms output signal 30 ($F_2$). Output signal 30 is a multiple of output signal 21, i.e. is equal to $F_1$ multiplied by coherency ratio M/N.

If multiplier 7 is a high precision multiplier, then output signal 30 can be made phase-coherent to output signal 21 directly. However, use of such a high precision multiplier 7 is costly in terms of gate count, power, area, and cost. The implementation shown in FIG. 1 uses a low precision multiplier 7 to minimize such costs and disadvantages. Use of a low precision multiplier 7 produces a low precision multiplier output 29, which is a second frequency word. The result is that phase accumulator 18 of NCO 9 produces an output signal 30 (after D/A conversion), which contains phase error with respect to the desired signal ($F_1$ multiplied by coherency ratio M/N). As explained below the remainder of the components in the schematic in FIG. 1 are present to provide a phase error correction so that output signal 30 is coherent with output signal 21.

Phase accumulator output 22 from NCO 1 is input to adder 3 in FIG. 1. Simultaneously, the negative of phase accumulator output 24 from NCO 9 is input to adder 3. Adder 3 combines the phase accumulator outputs and produces an adder output 25 which is equal to the difference between phase accumulator output 22 and phase accumulator output 24 at any given time. Thus, the phase data associated with the second frequency words are subtracted from the phase data associated with the first frequency words.

Phase accumulator output 22 is also input to counter 4. Counter 4 receives the most significant bit (MSB) of the phase accumulator output 22. Counter 4 produces counter output 23 to latch 5, when counter 4 reaches terminal count (N). Latch 5 "freezes" adder output 25 and produces latch output 27 when latch 5 receives counter output 23. Latch output 27 forms the input to a phase correction map 6 function, which provides a phase correction input to adder 8.

In function, the phase correction map 6 of FIG. 1 produces an error correction term for the multiplier output 29 based on the difference between the phase accumulator output 22 and phase accumulator output 24. Frequency control word 13 is thus adjusted to correct for the phase error between phase accumulators 18 and 16. As such, the low precision multiplier output 29 is corrected for the phase error between output signals 21 and output signal 30.

The timing of the error correction in phase is critical. The counter 4 counts the falling edges of the most significant bit of NCO 1 phase accumulator 16. The counter 4 generates the terminal count pulse every N most significant bit falling edges. The phase error measurement is valid every N cycles of NCO 1. If the multiply in multiplier 7 was perfect, NCO 9 would go through exactly M cycles every time NCO 1 went through N cycles. However, imperfections in the multiplier will result in a slight phase error which will be measured and latched (captured) with the latch 5. The phase error output, i.e. latch output 27 measured every N cycles of NCO 1 (i.e., at the appropriate time), is used by the phase correction map 6 to generate the phase correction profile to correct the measured phase error.

The phase correction map 6 will control how rapidly the phase error correction is made to phase accumulator 18. If low spurious characteristics are required on the output signal 30, the phase corrections can be made very gradually by phase correction map 6. If spurious characteristics are not a major concern, the phase correction to output signal 30 can be made in a single step by phase correction map 6.

Figure 2:
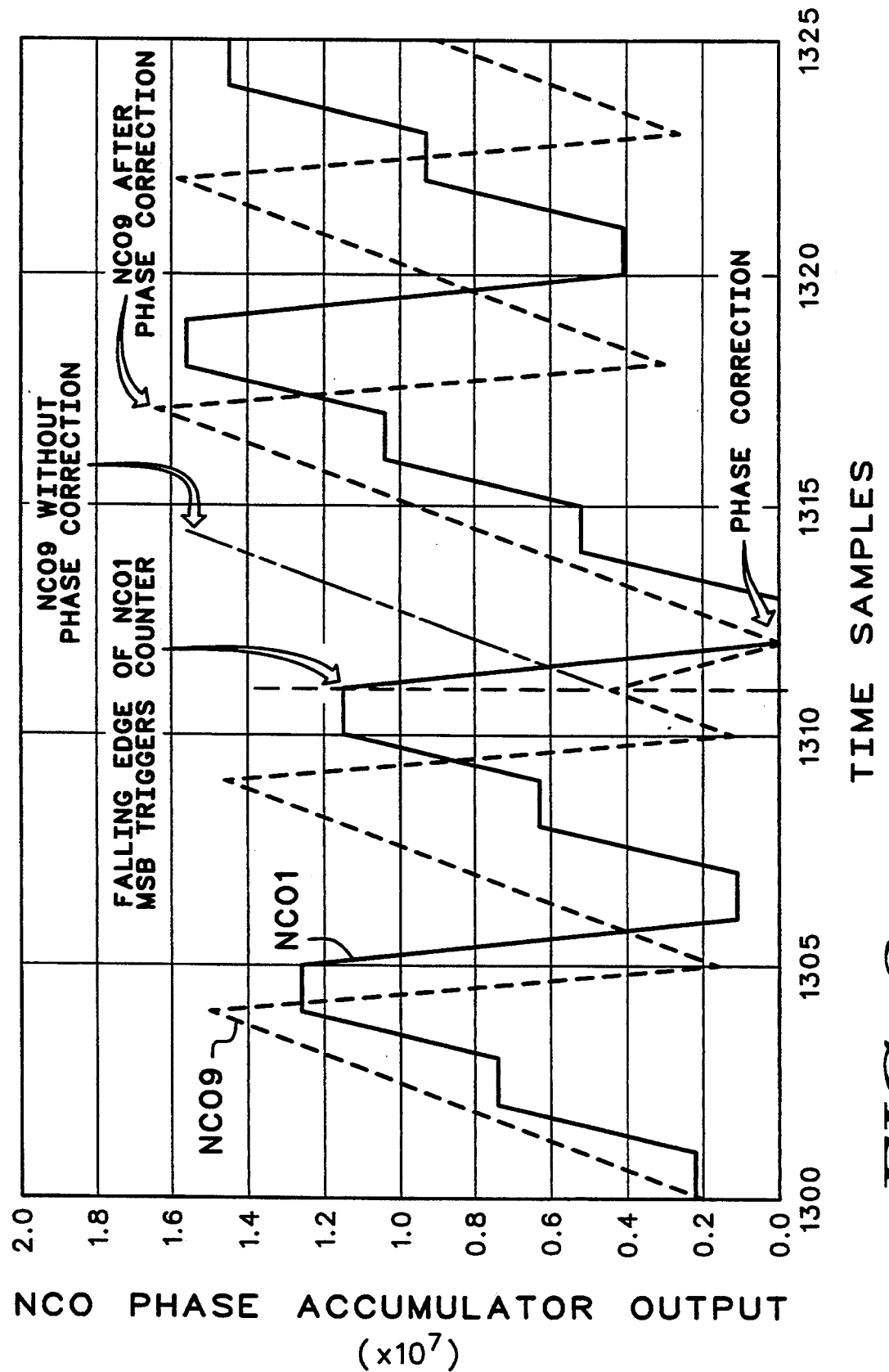
In FIG. 2, there is shown a plot of numerically-controlled oscillator (NCO) output versus time for a simulation of the device shown in FIG. 1.

FIG. 2 illustrates a plot of NCO output versus time for a simulation of the device shown schematically in FIG. 1. In the preferred embodiment n is 24, m is 12, and p is 24 for the frequency words described above. M in the preferred embodiment is 256 and N is 205. Twenty-four-bit outputs are used throughout in the preferred embodiment. In the simulation, m is approximately 2 to 3, n is 24, and p is 24. Capital M is 256 and N is 205. The simulation thus uses an extremely low-precision multiplication.

The FIG. 2 ordinate is NCO phase accumulator output in a scale times $10^7$. The abscissa is a scale of absolute number of clock cycles (labeled time samples in FIG. 2). At time 1311 on the abscissa of FIG. 2, the falling edge of NCO 1 most significant bit reaches the terminal count in counter 4 from FIG. 1. At 1312 on the abscissa, NCO 9 is phase corrected to be synchronized with NCO 1. Illustrated on FIG. 2 is NCO 9 output after phase correction (beginning at abscissa 1312) compared with NCO 9 output without phase correction (as it would have been had the phase correction not occurred at time 1311).

Figure 3:
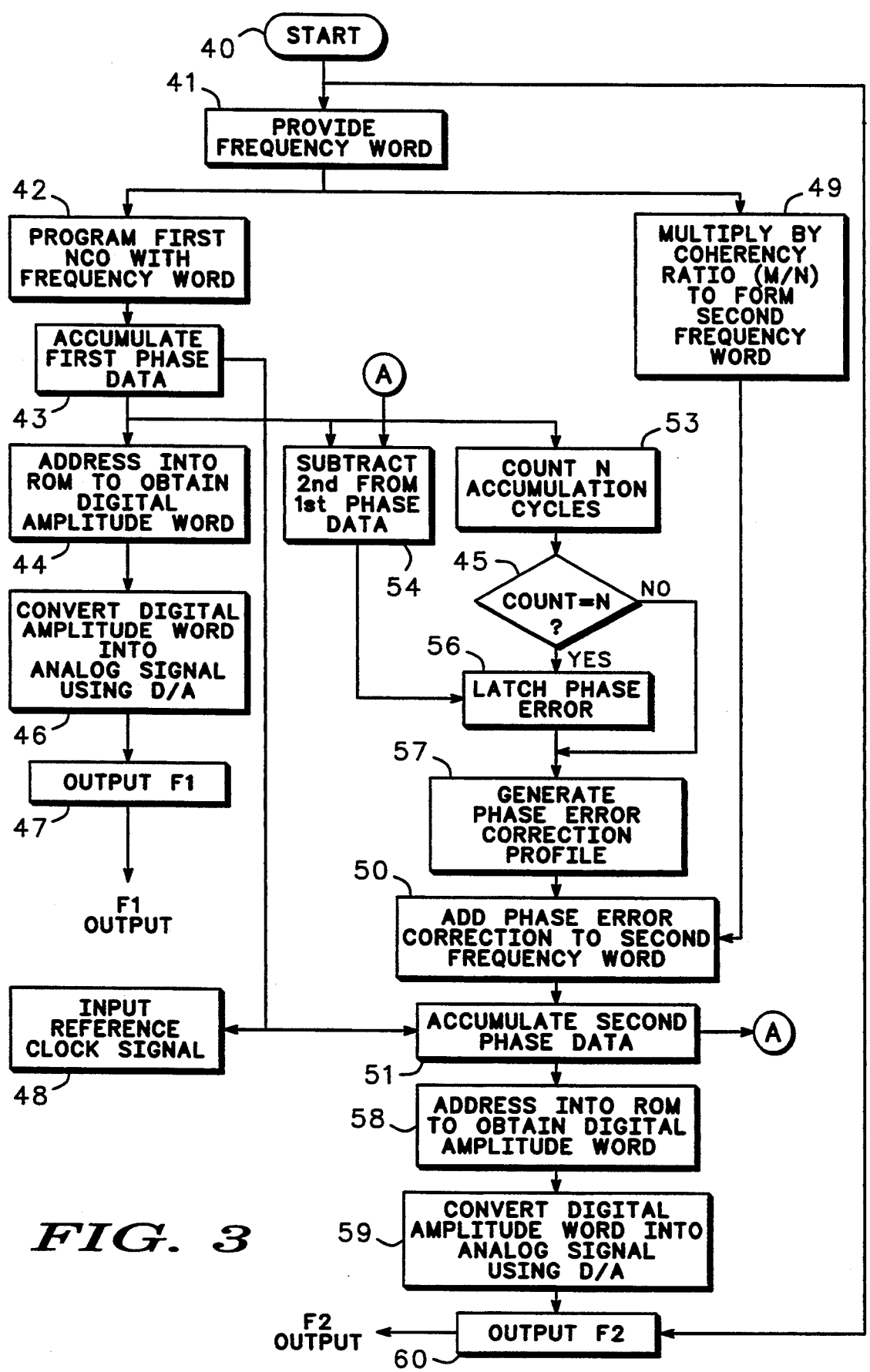
In FIG. 3, there is shown a flow chart of a method for generating two phase-coherent signals with arbitrary frequency ratio in accordance with a preferred method of the invention.

In FIG. 3, a flow chart is illustrated which depicts the method for generating two phase-coherent signals with arbitrary frequency ratio in accordance with the preferred method of the invention. After start box 40, the first step is to provide a first frequency word, in box 41. The first frequency word is used to program the first NCO, as illustrated in box 42. The first frequency word is also multiplied by coherency ratio M/N to form a second frequency word, as illustrated in box 49.

The output of box 42, the first phase data, is accumulated as shown in box 43. The branch from box 43 illustrates simultaneously activities, namely the addressing of the first phase data into ROM in box 44 to obtain in digital amplitude words, the subtraction of the second phase data from the first phase data in box 54 and the simultaneous counting of N accumulation cycles in box 53. The digital amplitude words from the ROM in box 44 are processed in box 46 and digitally-to-analog converted to provide output $F_1$ in box 47.

The counter output from box 53 forms an input to box 45 where the count value is compared to the terminal count value (N). If the count value is equal to N in box 45, the phase error output from box 54 is latched as illustrated in box 56. The latched phase error is used to generate a phase error correction profile in box 57. The phase error correction is added to the second frequency word in box 50. The Second frequency word was received from box 49 and represents the product of the multiplication of the first frequency word from box 41 by coherency ratio M/N.

The result of the addition of phase error correction to the second frequency word, i.e. the result of the step shown in box 50, is input to box 51. Box 51 illustrates the accumulation of second phase data from the output of box 50 in response to a reference clock signal input as shown in box 48. The reference clock signal 48 can also be used to clock the accumulation of first phase data as shown by the box 48 to box 43 input. The output of the accumulation of second phase data from box 51 proceeds via reference letter A, 52 on the FIG. 3 flowchart, and is input to box 54 (the subtraction of second from first phase data step).

The accumulation of second phase data from box 51 in FIG. 3 also is input to box 58. Box 58 illustrates the addressing of the second phase data into ROM in box 58 to obtain digital amplitude words. The digital-to-analog conversion step in box 59 converts the digital amplitude data from box 58 to form the output $F_2$ in box 60. The output $F_2$ in box 60 is the output $F_1$ from box 47 multiplied by the coherency ratio M/N, after phase error correction.

Thus, a method and apparatus for generating two phase-coherent signals with arbitrary frequency ratio has been described which overcomes specific problems and accomplishes certain advantages relative to prior art methods and mechanisms. The improvements over known technology are significant. The method and apparatus provide a flexible means for generating two phase-coherent signals of arbitrary frequency ratio within a single design. Use of a low-precision multiplier results in a reduction in complexity, cost, size, and power requirements. Such improvements are particularly suitable for satellite or other space applications. An additional advantage is that the output signal spurious signal content can be controlled by selecting the rate at which phase corrections to the output signal are made.

Thus, there has also been provided, in accordance with an embodiment of the invention, a method and apparatus for generating two phase-coherent signals with arbitrary frequency ratio that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A method for generating phase-coherent first and second signals with an arbitrary frequency ratio, the method comprising the steps of:
    programming a first numerically controlled oscillator (NCO) with a first frequency word to produce a first NCO output;
    processing the first NCO output to produce the first signal;
    multiplying the first frequency word in a multiplier to produce a second frequency word;
    correcting the second frequency word for error in phase relative to the first frequency word, producing a corrected second frequency word;
    programming a second NCO with the corrected second frequency word to produce a second NCO output; and
    processing the second NCO output to produce the second signal.

2. A method as claimed in claim 1, further comprising the step of programming the first NCO, processing the first NCO output, multiplying the first frequency word, correcting the second frequency word, programming the second NCO, and processing the second NCO output repeated by a plurality of first frequency words, each of n bits.

3. A method as claimed in claim 2, wherein the step of programming the first NCO comprises the steps of:
    inputting a reference clock signal;
    accumulating first phase data corresponding to each of the plurality of first frequency words; and
    addressing the first phase data into a first read only memory (ROM).

4. A method as claimed in claim 1, wherein the step of processing the first NCO output comprises the step of digital-to-analog (D/A) converting the first NCO output.

5. A method as claimed in claim 1, wherein the step of multiplying the first frequency word comprises the step of multiplying the first frequency word by a coherency ratio in a low-precision multiplier to produce a second frequency word comprising p bits.

6. A method as claimed in claim 3, wherein the step of programming the second NCO comprises the steps of:
    inputting the reference clock signal;
    accumulating second phase data corresponding to each of a plurality of second frequency words; and
    addressing the second phase data into a second read only memory (ROM).

7. A method as claimed in claim 6, wherein the step of correcting the second frequency word comprises the step of subtracting the second phase data from the first phase data using a phase adder.

8. A method as claimed in claim 7, wherein the step of correcting the second frequency word further comprises the step of latching a phase error on a terminal count of a counter every N cycles of accumulation of the first phase data.

9. A method as claimed in claim 8, wherein the step of correcting the second frequency word further comprises the step of generating a phase correction profile to correct the error in phase.

10. A method as claimed in claim 9, wherein the step of correcting the second frequency word further comprises the step of controlling correction of the error in phase in accordance with the phase correction profile.

11. A method as claimed in claim 1, wherein the step of processing the second NCO output comprises the step of digital-to-analog (D/A) converting the second NCO output digital-to-analog (D/A).

12. A device for generating phase-coherent first and second signals with an arbitrary frequency ratio, the device comprising:
    a first numerically controlled oscillator (NCO) for receiving a first frequency word and producing a first NCO output;
    a first digital to analog (D/A) converter coupled to the first NCO, the D/A converter for processing the first NCO output to produce the first signal;
    a multiplier for receiving the first frequency word and for multiplying the first frequency word to produce a second frequency word;
    a means for correcting the second frequency word for error in phase relative to the first frequency word to produce a corrected second frequency word, the means for correcting coupled to the multiplier and to the first NCO;

a second NCO for receiving the corrected second frequency word to produce a second NCO output, the second NCO coupled to the means for correcting; and a second D/A converter for processing the second NCO output to produce the second signal.

13. A device as claimed in claim 12, further comprising a reference clock coupled to the first NCO and to the second NCO, the reference clock for providing a reference clock signal.

14. A device as claimed in claim 12, wherein the first NCO comprises:

a first phase accumulator for receiving the first frequency word and for producing a first phase accumulator output;

a first read only memory (ROM) coupled to the first phase accumulator, the first ROM for receiving the first phase accumulator output and for producing the first NCO output.

15. A device as claimed in claim 12, wherein the second NCO comprises:

a second phase accumulator for receiving the second frequency word and for producing a second phase accumulator output;

a second read only memory (ROM) coupled to the second phase accumulator, the second ROM for receiving the second phase accumulator output and for producing the second NCO output.

16. A device as claimed in claim 15, wherein the multiplier comprises a low-precision multiplier.

17. A device as claimed in claim 12, wherein the means for correcting comprises a phase adder for subtracting second phase data from first phase data to produce a phase error, the first phase data corresponding to a plurality of first frequency words received by the first NCO and the second phase data corresponding to a plurality of second frequency words received by the second NCO.

18. A device as claimed in claim 17, wherein the means for correcting further comprises:

a counter coupled to the first NCO, the counter for providing a terminal count every N cycles of accumulation of the first phase data;

a latch coupled to the counter and to the phase adder, the latch for latching the phase error in response to the terminal count.

19. A device as claimed in claim 18, wherein the means for correcting further comprises a phase correction map means coupled to the latch, to the multiplier, and to the second NCO, the phase correction map means for controlling correction of the phase error.

20. A transponder including a generator of phasecoherent first and second signals with an arbitrary frequency ratio, the generator comprising:

a first numerically controlled oscillator (NCO) for receiving a first frequency word and producing a first NCO output;

a first digital to analog (D/A) converter coupled to the first NCO, the D/A converter for processing the first NCO output to produce the first signal;

a multiplier for receiving the first frequency word and for multiplying the first frequency word to produce a second frequency word;

a means for correcting the second frequency word for error in phase relative to the first frequency word to produce a corrected second frequency word, the means for correcting coupled to the multiplier and to the first NCO;

a second NCO for receiving the corrected second frequency word to produce a second NCO output, the second NCO coupled to the means for correcting; and a second (D/A) converter for processing the second NCO output to produce the second signal.

21. A transponder including a generator as claimed in claim 20, further comprising a reference clock coupled to the first NCO and to the second NCO, the reference clock for providing a reference clock signal.

22. A transponder including a generator as claimed in claim 20, wherein the first NCO comprises:

a first phase accumulator for receiving the first frequency word and for producing a first phase accumulator output;

a first read only memory (ROM) coupled to the first phase accumulator, the first ROM for receiving the first phase accumulator output and for producing the first NCO output.

23. A transponder including a generator as claimed in claim 20, wherein the second NCO comprises:

a second phase accumulator for receiving the second frequency word and for producing a second phase accumulator output;

a second read only memory (ROM) coupled to the second phase accumulator, the second ROM for receiving the second phase accumulator output and for producing the second NCO output.

24. A transponder including a generator as claimed in claim 20, wherein the means for correcting comprises a phase adder for subtracting second phase data from first phase data to produce a phase error, the first phase data corresponding to a plurality of first frequency words received by the first NCO and the second phase data corresponding to a plurality of second frequency words received by the second NCO.

25. A transponder including a generator as claimed in claim 24, wherein the means for correcting further comprises:

a counter coupled to the first NCO, the counter for providing a terminal count every N cycles of accumulation of the first phase data;

a latch coupled to the counter and to the phase adder, the latch for latching the phase error in response to the terminal count.

26. A transponder including a generator as claimed in claim 25, wherein the means for correcting further comprises a phase correction map means coupled to the latch, to the multiplier, and to the second NCO, the phase correction map means for controlling correction of the phase error.

* * * * *